(12) United States Patent
Youm et al.

(10) Patent No.: US 9,671,484 B2
(45) Date of Patent: Jun. 6, 2017

(54) MAGNETIC SENSOR TEST APPARATUS AND METHOD OF TESTING A MAGNETIC SENSOR

(71) Applicant: HAECHITECH CORPORATION, Cheongju-si (KR)

(72) Inventors: Ki-bog Youm, Cheongju-si (KR); Young-bae Choi, Cheongju-si (KR); Young-sug Seong, Cheongju-si (KR); Kyung-seok Jin, Seoul (KR)

(73) Assignee: HAECHITECH CORPORATION, Cheongju-si (KR)

( * ) Notice: Subject to any disclaimer, the term of this patent is extended or adjusted under 35 U.S.C. 154(b) by 53 days.

(21) Appl. No.: 14/287,878

(22) Filed: May 27, 2014

(65) Prior Publication Data
US 2015/0042318 A1    Feb. 12, 2015

(30) Foreign Application Priority Data
Aug. 8, 2013  (KR) .................. 10-2013-0094134

(51) Int. Cl.
*G01R 35/00*    (2006.01)

(52) U.S. Cl.
CPC .................. *G01R 35/00* (2013.01)

(58) Field of Classification Search
CPC .... G01R 35/00; G01R 33/09; G01R 1/07307; G01R 33/0035; G01R 33/0023; G01R 31/2896; G11B 5/455
USPC ......................................... 324/210
See application file for complete search history.

(56) References Cited

U.S. PATENT DOCUMENTS

| | | | | |
|---|---|---|---|---|
| 5,425,367 A | * | 6/1995 | Shapiro | A61B 5/06 128/899 |
| 6,476,602 B1 | * | 11/2002 | Gray | B82Y 10/00 324/210 |
| 7,345,470 B2 | * | 3/2008 | Suzuki | G01R 31/2829 324/202 |
| 2008/0111544 A1 | * | 5/2008 | Patland | H01F 7/20 324/232 |
| 2009/0147389 A1 | * | 6/2009 | Taratorin | G11B 5/3166 360/31 |
| 2009/0206831 A1 | * | 8/2009 | Fermon | G01N 27/9046 324/240 |
| 2011/0304328 A1 | * | 12/2011 | Yamamoto | G01N 27/9033 324/240 |

(Continued)

FOREIGN PATENT DOCUMENTS

JP    2004151056 A  *  5/2004
JP    2006-24845 A      1/2006

(Continued)

OTHER PUBLICATIONS

Korean Office Action issued on Aug. 29, 2014 in counterpart Korean Application No. 10-2013-0094134. (7 Pages in Korean).

*Primary Examiner* — Jay Patidar
(74) *Attorney, Agent, or Firm* — NSIP Law (57) ABSTRACT

Provided are a magnetic sensor test apparatus and a magnetic sensor test method. The magnetic sensor test apparatus includes a vertical coil and at least one periphery coil disposed peripherally about the vertical coil. Both the vertical coil and the periphery coil may be configured to generate a horizontal and/or a vertical magnetic field in a semiconductor wafer.

20 Claims, 8 Drawing Sheets

(56) References Cited

U.S. PATENT DOCUMENTS

| | | | |
|---|---|---|---|
| 2013/0009632 A1* | 1/2013 | Yamamoto | G01N 27/9046 324/222 |
| 2013/0009659 A1 | 1/2013 | Liu et al. | |
| 2013/0038321 A1* | 2/2013 | Suzuki | G01R 35/00 324/224 |
| 2014/0020481 A1* | 1/2014 | May | G01L 1/127 73/862.69 |
| 2014/0191751 A1* | 7/2014 | Suzuma | G01N 27/83 324/232 |
| 2016/0011277 A1* | 1/2016 | Chen | G01R 33/0023 324/202 |

FOREIGN PATENT DOCUMENTS

| | | | | |
|---|---|---|---|---|
| JP | 2011-53183 | * | 3/2011 | ............. G01R 33/20 |
| JP | 2012-198102 A | | 10/2012 | |

\* cited by examiner

FIG. 7

US 9,671,484 B2

MAGNETIC SENSOR TEST APPARATUS AND METHOD OF TESTING A MAGNETIC SENSOR

CROSS-REFERENCE TO RELATED APPLICATIONS

This application claims the benefit under 35 USC 119(a) of Korean Patent Application No. 10 2013 0094134 filed on Aug. 8, 2013, in the Korean Intellectual Property Office, the entire disclosure of which is incorporated herein by reference for all purposes.

BACKGROUND

1. Field

The following description relates to a magnetic sensor test apparatus and method for testing a magnetic sensor.

2. Description of Related Art

A wafer may correspond to a semiconductor substrate including a plurality of chips, and a plurality of chips may correspond to magnetic sensors. Typically, the magnetic sensors separate each of a plurality of chips in order to follow package procedures, and each of the magnetic sensors may be tested after packaging.

A magnetic sensor related technique is disclosed in U.S application No. 2013-0009659. U.S application No. 2013-0009659 may equip a coil at multi axis in a probe card to test a magnetic sensor in a packaged state.

Typically, when a magnetic sensor is determined to be an abnormal sensor during or after the package procedure, the cost and time for remaking a normal magnetic sensor is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a magnetic sensor test apparatus includes a magnetic sensor; a vertical coil; and at least one periphery coil.

The magnetic sensor test apparatus may include a wafer including the magnetic sensor; and a probe card, and the vertical coil may be arranged above the wafer and the at least one periphery coil may be symmetrically arranged around the vertical coil.

The at least one periphery coil may be configured to generate a magnetic field in a horizontal direction to the wafer.

The at least one periphery coil may be arranged at an acute angle with a surface of the wafer.

The at least one periphery coil may include four coils.

The acute angle may be less than 90 degree.

The four coils may include a pair of first coils being arranged in a first axis direction; and a pair of second coils being arranged in a second axis direction, the second axis direction being perpendicular to the first axis direction.

The magnetic sensor test apparatus may include a plurality of probe tips configured to detect a test signal output from the magnetic sensor.

The at least one periphery coil may be spaced apart from the vertical coil by a distance.

In another general aspect, a magnetic sensor test method includes generating a magnetic field in a vertical direction; and generating a magnetic field in a horizontal direction.

The magnetic sensor test method may be applied to a wafer including a plurality of magnetic sensors; the generating a magnetic field in a vertical direction may include generating a magnetic field in a vertical direction of the wafer; and the generating a magnetic field in a horizontal direction may include generating a magnetic field in a horizontal direction of the wafer.

The generating a magnetic field in a vertical direction may include applying a current to a vertical coil to test a strength of a vertical component of the magnetic field.

The generating a magnetic field in a horizontal direction may include applying a current to pairs of first and second coils to test a strength of a horizontal component of the magnetic field, the pairs of the first and second coils being arranged at an acute angle with a surface of the wafer.

The generating of a magnetic field in a vertical direction and a horizontal direction respectively may include testing whether the plurality of the magnetic sensors operate normally.

The execution order of the generating a magnetic field in a vertical direction and the generating a magnetic field in a horizontal direction may be irrelevant to each other.

In another general aspect, a magnetic sensor test apparatus includes a probe; a vertical coil arranged at the center of the probe; and two or more periphery coils arranged symmetrically around the vertical coil.

The magnetic sensor test apparatus may include a wafer comprising a magnetic sensor.

The two or more periphery coils may be arranged at an acute angle with a surface of the wafer.

The two or more periphery coils may be four periphery coils which are arranged equidistantly from the vertical coil.

The two or more periphery coils may be arranged at an angle of 45 degrees and generate an even magnetic field.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
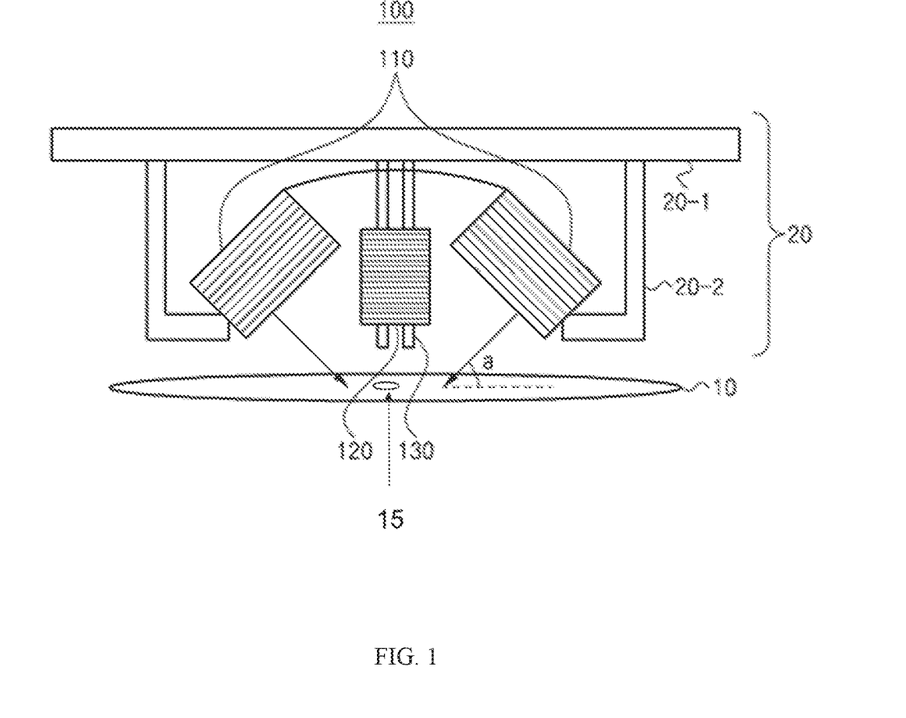
FIG. 1 is a diagram illustrating an example of a magnetic sensor test apparatus.
Figure 2:
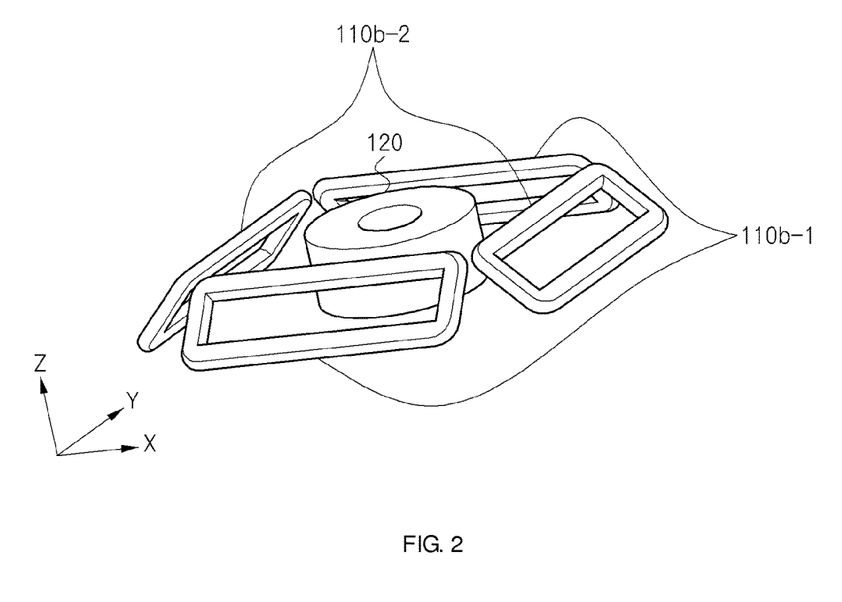
FIG. 2 is a diagram illustrating an example of a plurality of coils arranged in a probe card of a magnetic sensor test apparatus.

FIG. 1 is a cross sectional diagram illustrating an example of a magnetic sensor test apparatus and FIG. 2 is a perspective diagram illustrating an example of a plurality of coils arranged in a probe card of the magnetic sensor test apparatus of FIG. 1.

Referring to FIGS. 1 and 2, the magnetic sensor test apparatus 100 includes a wafer 10, a probe card 20, at least one periphery coil 110, a vertical coil 120, and a plurality of probe tips 130.

The wafer 10 is a thin plate of a semiconductor including a magnetic sensor 15 and may be cut to a specific size when testing whether the magnetic sensor 15 is normally operated. Testing is completed by using a magnetic field. The magnetic field is generated according to the vertical coil 120 and the at least one periphery coil 110 arranged in the probe card 20.

The probe card 20 corresponds to a device connecting the magnetic sensor 15 and a test header for testing operations of a semiconductor (i.e., testing operations of a magnetic sensor 15). The probe card 20 may send electricity when the probe tip 130 contacts a magnetic sensor 15 arranged on the wafer 10. In this example, the probe card 20 selects an abnormal magnetic sensor 15 according to a feedback signal received by sending electricity. The probe card 20 includes a PCB (Printed Circuit Board) 20-1, a supporting unit 20-2, and at least one periphery coil 110. In this example, the PCB 20-1 may be arranged on an upper side of the probe card 20 and may support the at least one periphery coil 110 through the supporting unit 20-2 connected with both lower side of the PCB 20-1. The supporting unit 20-2 may be implemented in an "L" shape.

The at least one periphery coil 110 is arranged in the probe card 20 and is symmetrically arranged around the vertical coil 120.

The at least one periphery coil 110 generates a magnetic field on a upper side of the magnetic sensor 15 arranged on the wafer 10 and is arranged in an acute angle "a" with a surface of the wafer 10 in the probe card 20. The acute angle "a" may increase a transmit and receive sensitivity of the at least one periphery coil 110 about the magnetic field being generated on upper side of the magnetic sensor 15. The magnetic sensor 15 includes a hall element reacting according to the Hall Effect.

When the at least one periphery coil 110 receives a current, the at least one periphery coil 110 generates a magnetic field and both ends of the at least one periphery coil 110 may be separated into an N-pole and an S-pole to generate the magnetic field. In this example, the magnetic field may be displayed as a curve of magnetic field force lines being directed to the S-pole from the N-pole, and the magnetic field force lines may be generated so as not to be broken underway and not to intersect each other.

The at least one periphery coil 110 may be elliptically generated and may generate the magnetic field in a horizontal direction on the wafer 10. For example, the at least one periphery coil 110 may include two or four coils.

The at least one periphery coil 110 may generate the magnetic field in first and second axes directions of a horizontal direction to sequentially or simultaneously test whether the magnetic sensor 15 is normally operated about the magnetic field of the first and second axes directions. For example, the first axis may correspond to the X-axis and the second axis may correspond to the Y-axis of a Cartesian coordinate system.

The at least one periphery coil 110 may be slantingly arranged in an acute angle "a" toward the wafer 10. That is, the at least one periphery coil 110 may be not arranged in a vertical or horizontal direction on a surface of the wafer 10 but may be arranged in a slope of less than 90 degree. For example, the at least one periphery coil 110 may be arranged in an angle of less than 90 degree between a coil winding direction and the surface of the wafer 10.

When one side of the probe tip 130 contacts the magnetic sensor 15 of the wafer 10, the at least one periphery coil 110 may generate the magnetic field about the first axis direction (i.e., X) and the second axis direction (i.e., Y) to test whether the magnetic sensor 15 is normally operated. For example, the at least one periphery coil 110 may generate an even magnetic field to the first and second axes of the magnetic sensor 15. The at least one periphery coil 110 may sequentially or simultaneously generate the magnetic field about each of the first and second axes.

In an example, the at least one periphery coil 110 may be arranged in an angle of less than 90 degree with the surface of the wafer 10. For example, the at least one periphery coil 110 may be arranged in a 45 degree angle. Accordingly, each of the magnetic sensors 15 may generate an even magnetic field strength in the wafer 10 through the at least one periphery coil 110 when the at least one periphery coil 110 is arranged at a 45 degree angle.

The at least one periphery coil 110 may include more than one periphery coil 110 which are arranged to face each other at an angle of 70 through 110 degree with the horizontal parallel surface. The at least one periphery coil 110 may be implemented as Helmholtz coils being electrically connected to each other. For example, the Helmholtz coils are spaced apart from each of two coaxial coils at a predetermined radius and the magnetic field may be constantly generated between the two coaxial coils.

Figure 3:
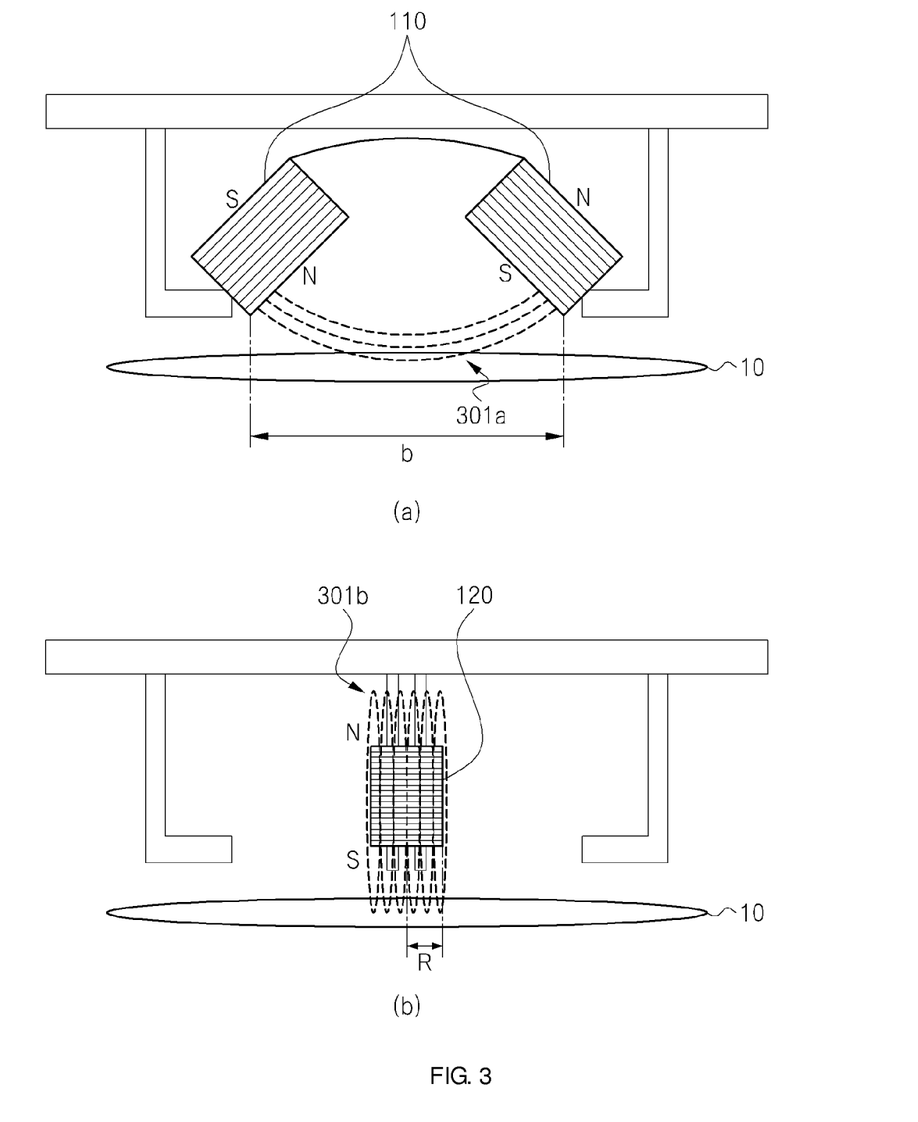
FIGS. 3A and 3B are diagrams illustrating an example of a magnetic field being generated in a coil arranged in a probe card of the magnetic sensor test apparatus.

The at least one periphery coil 110 may be spaced apart from the vertical coil 120 at a distance. Also, the at least one periphery coil 110 may be spaced apart from the upper side of the magnetic sensor at the same distance. In an example, the distance may be proportional to a total width of the magnetic sensor to generate an even magnetic field at the magnetic sensor. Referring to FIG. 3a, the at least one periphery coil 110 may be spaced apart from the upper side of the magnetic sensor by a distance of b and may be arranged in each of the first and second axes. When the at least one periphery coil 110 receives a current to be separated to the N-pole and S-pole, the at least one periphery coil 110 generates the magnetic field 301*a* between a separated distance b to apply an even magnetic field 301*a* to the magnetic sensor on the wafer 10. FIG. 3*a* illustrates an example of a magnetic field 301*a* being generated from the at least one periphery coil 110 arranged in the first or second axis.

The vertical coil 120 is arranged in the probe card 20 in the wafer 10 and generates a magnetic field in vertical direction.

The vertical coil 120 is implemented as a coil of solenoid type, is arranged in the magnetic field generated by the at least one periphery coil 110 in the probe card 20, and covers the magnetic sensor on the upper side to test whether the magnetic sensor operates normally about a third axis.

In an example, since the probe card 20 tests whether the magnetic sensor operates normally through a magnetic field generated about the first and second axes directions using the at least one periphery coil 110, the vertical coil 120 may receive a current to test whether the magnetic sensor operates normally about a third axis of the magnetic sensor. For example, an execution order of the first, second and third axes may be irrelevant to each other.

Referring to FIG. 3*b*, a radius of the vertical coil 120 may be determined according to a total width of the magnetic sensor. For example, the radius of the vertical coil 120 may be proportional to a total width of the magnetic sensor. The radius of the vertical coil 120 may cover the total width of the magnetic sensor in order to make the magnetic field cover up the whole surface of the magnetic sensor. In another example, the radius of the vertical coil 120 may cover part of the total width of the magnetic sensor around a center of the magnetic sensor in order to generate a magnetic field to the whole surface of the magnetic sensor.

The vertical coil 120 may be arranged between the one or more periphery coils 110 which are arranged to face each other on the surface of the magnetic sensor. When the vertical coil 120 receives a current to be separated to the N-pole and S-pole, the vertical coil 120 may generate a magnetic field 301*b* to apply an even magnetic field at the magnetic sensor. FIG. 3*b* illustrates an example of a magnetic field 301*b* being generated from the vertical coil 120 arranged in the third axis.

A plurality of probe tips 130 detect a test signal being outputted from the magnetic sensor according to the magnetic field generated in the at least one periphery coil 110 or the vertical coil 120.

In an example, a plurality of probe tips 130 may transmit the test signal detecting whether a tested magnetic sensor is normally operating using a test header. The tested magnetic sensor is tested according to the magnetic field generated in the at least one periphery coil 110 or the vertical coil 120. For example, a test header may analyze a received test signal from a plurality of probe tips 130 to compare the received test signal with a predetermined test signal value reflecting normal operations of the magnetic sensor. The test header may measure the magnetic sensor as operating normally when the test signal value received from the probe tips 130 and the test signal value reflecting normal operations are equal. Also, the test header may measure the magnetic sensor as faulty when the test signal value received from the probe tips 130 and the test signal value reflecting normal operations are different.

Figure 4:
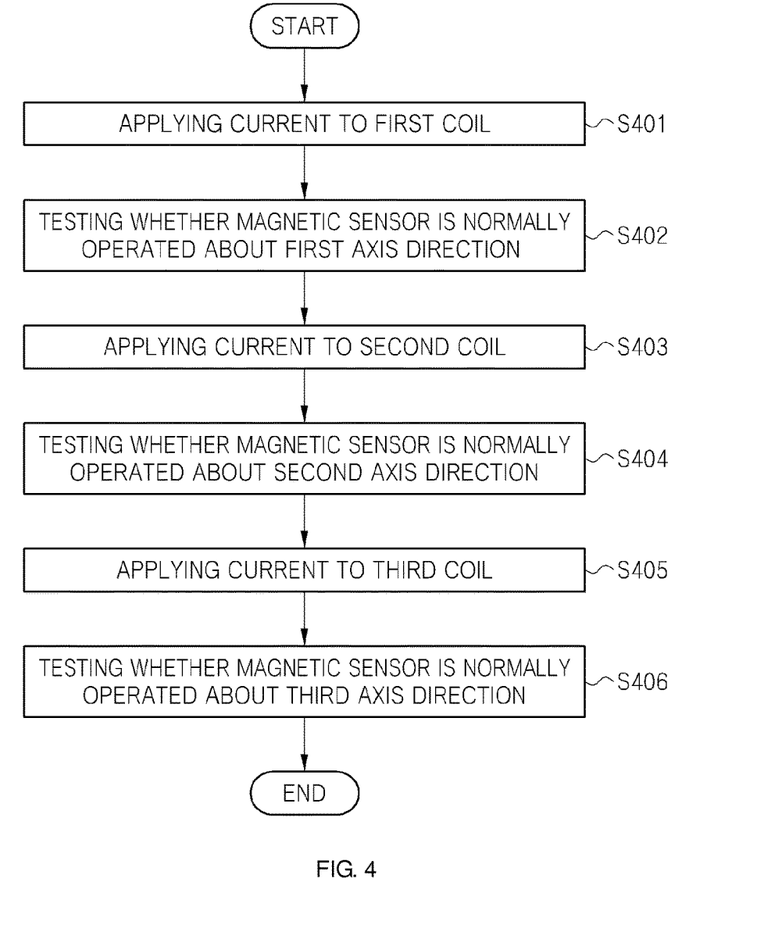
FIG. 4 is a diagram illustrating an example of a magnetic sensor test procedure in a magnetic sensor test apparatus.

FIG. 4 is a flowchart illustrating an example of a pre-generated magnetic sensor test procedure applied to the magnetic sensor test apparatus of FIG. 1.

Referring to FIG. 4, the magnetic sensor test apparatus 100 applies current or voltage to a pair of first coils 110 arranged on the probe card 20 in an acute angle with the surface of the wafer 10 (Step S401).

The pair of first coils 110 are symmetrically arranged in a first axis direction around the vertical coil 120 and are elliptically generated to test whether the magnetic sensor is operates normally about the magnetic field strength of the first axis direction (i.e., horizontal component) (Step S402). For example, the first axis may correspond to the X-axis.

The magnetic sensor test apparatus 100 applies current or voltage to a pair of second coils 110 arranged on the probe card 20 in an acute angle with the surface of the wafer 10 (Step S403).

The pair of second coils 110 are symmetrically arranged in a second axis direction around the vertical coil 120 and are elliptically generated to test whether the magnetic sensor operates normally about the magnetic field strength of the second axis direction (i.e., vertical component) (Step S404). The second axis direction has a vertical relation with the first axis direction. For example, the second axis may correspond to the Y-axis.

Figure 5A:
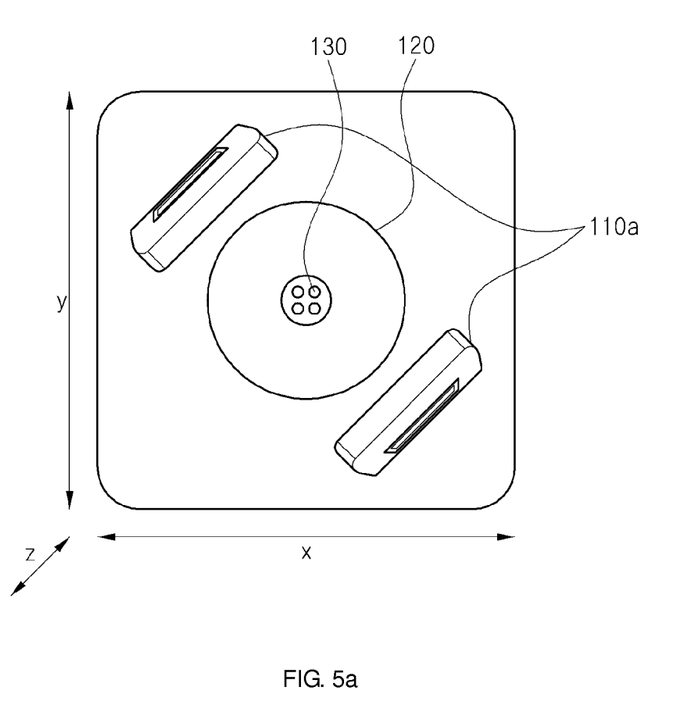
FIGS. 5A and 5B are diagrams illustrating an example of a magnetic sensor test apparatus.

Referring to FIG. 5*a*, a pair of the periphery coils 110*a* may be arranged to generate a node at each of the first and second axes. For example, an extension line perpendicular to a side of the pair of the periphery coils 110*a* may intersect each of the first and second axes (i.e., X and Y axes) to generate a node. The pair of the periphery coils 110*a* may be arranged in an angle of less than 90 degree with the surface of the wafer 10. The pair of the periphery coils 110*a* may correspond to Helmholtz coils arranged at 45 degree to sequentially test whether the magnetic sensor is normally operated about the magnetic field strength of each of the first and second axes directions. An angle of 45 degrees is illustrated for convenience and should not be intended to limit the scope of the present invention.

In an example, the pair of the periphery coils 110*a* are spaced apart from the vertical coil 120 by an equal distance between an extension line from a left upper corner to the plurality of probe tips 130 and an extension line from a right lower corner to a plurality of probe tips 130. In another example, the pair of the periphery coils 110*a* may be spaced apart from the vertical coil 120 by an equal distance between an extension line from a left lower corner to a plurality of probe tips 130 and an extension line from a right upper corner to a plurality of probe tips 130.

Figure 5B:
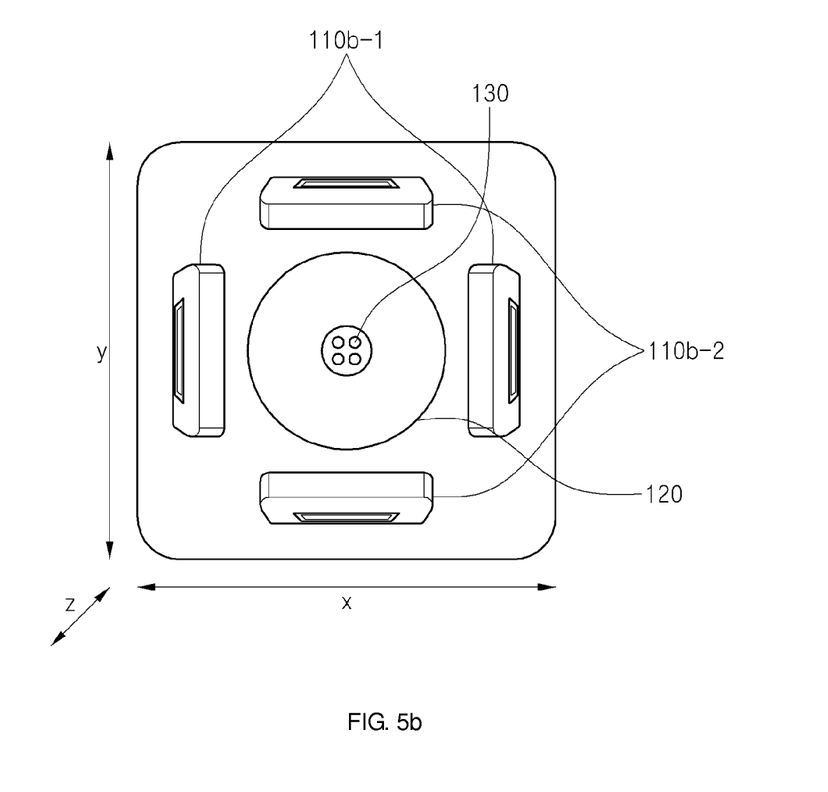

Referring to FIG. 5*b*, the pair of first coils 110*b*-1 may be arranged in the first axis (i.e., X), the first axis direction having a vertical relation with the second axis direction (i.e., Y), and the pair of second coils 110*b*-2 may be arranged in the second axis (i.e., Y), the second axis direction having a vertical relation with the first axis direction (i.e., X). In this example, each of the pair of the first coils 110*b*-1 and the second coils 110*b*-2 may correspond to Helmholtz coils being arranged in the supporting unit 20-2 of the probe card 20 in a 45 degree angle with the surface of the wafer 10. Each of the pair of the first coils 110*b*-1 and the second coils 110*b*-2 may sequentially test whether the magnetic sensor operates normally about the magnetic field strength of each of the first and second axes directions (i.e., X and Y axes). Each of the pair of the first coils 110*b*-1 and the second coils 110*b*-2 are spaced apart from the vertical coil 120 by a distance to be arranged to face each other in parallel.

The magnetic sensor test apparatus 100 is arranged in a magnetic field generated by the pair of first and second coils 110b-1 and 110b-2 and applies a current to the vertical coil 120 covering the magnetic sensor on an upper side (Step S405).

The vertical coil 120 is circularly generated to test whether the magnetic sensor operates normally about a magnetic field strength of a third axis direction (i.e., a vertical component) (Step S406). For example, the third axis may correspond to a Z-axis.

Figure 6:
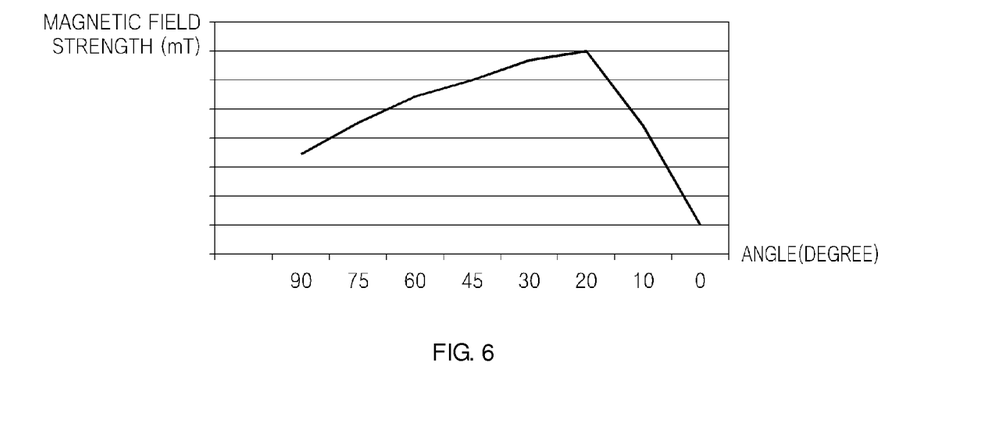
FIG. 6 is a diagram illustrating an example of magnetic field strength according to an angle generated through first and second coils of a magnetic sensor test apparatus outside a center of a magnetic sensor.
Figure 7:
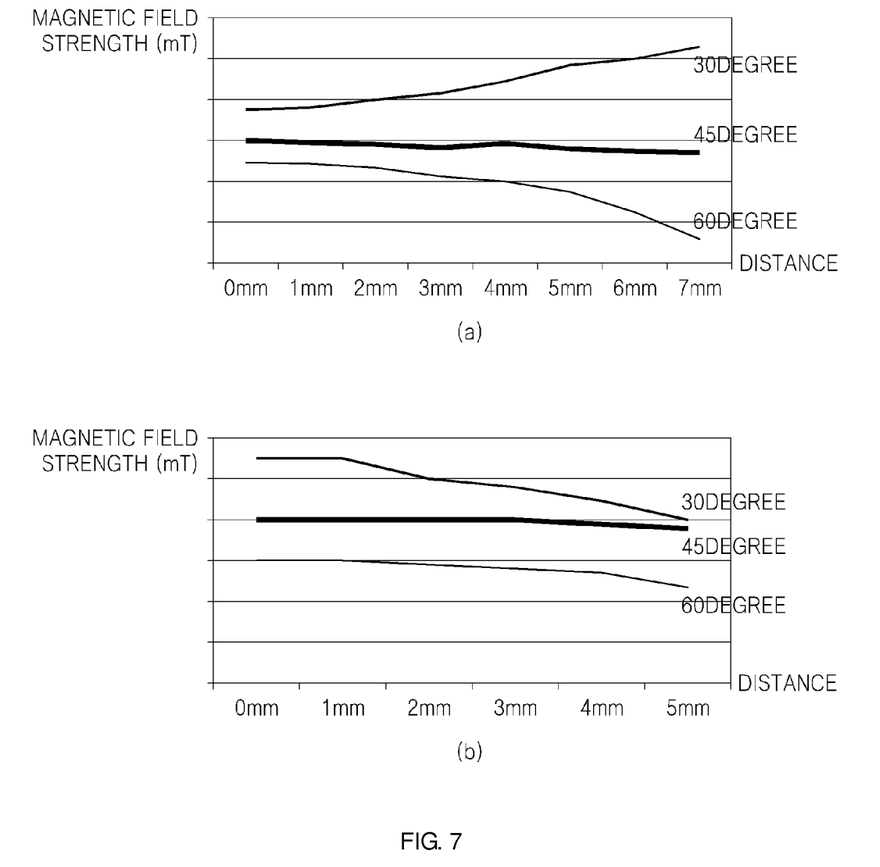
FIGS. 7A and 7B are diagrams illustrating an example of magnetic field uniformity about first and second axis according to an angle of first and second coils in a magnetic sensor test apparatus.

FIG. 6 is a graph illustrating an example of magnetic field strength according to an angle generated through first and second coils of a magnetic sensor test apparatus toward the outside of a center of the magnetic sensor of FIG. 1. FIG. 7 is a graph illustrating magnetic field uniformity about first and second axis according to the angle of the first and second coils in the magnetic sensor test apparatus of FIG. 1.

Referring to FIGS. 6 and 7, a magnetic field strength of each of the pair of the first and second coils 110 may be varied according to the acute angle with the surface of the wafer 10 arranged toward outside the center of the magnetic sensor. The magnetic field strength of each of the pair of the first and second coils 110 may increase as each of the pair of the first and second coils 110 is arranged in an acute angle (i.e., 10 degrees through 75 degrees) than when each of the pair of the first and second coils 110 is arranged in a right angle (i.e., 90 degree) with the center of the magnetic sensor.

For example, each of the pair of the first and second coils 110 may generate the largest magnetic field strength when each of the pair of the first and second coils 110 are arranged in an acute angle of 20 degree from the center of the magnetic sensor and may generate an even magnetic field to the magnetic sensor when arranged in a 45 degree. In FIG. 7, each of the pair of the first and second coils 110 may be arranged at 30 degrees, 45 degrees or 60 degrees with the surface of the wafer 10, and the magnetic sensor test apparatus 100 may measure the magnetic field generated at the upper side of the magnetic sensor as a constant interval from a center of the magnetic sensor to the first axis direction or the second axis direction. In this case, the magnetic sensor test apparatus 100 may generate the most constant magnetic field when each of the pair of the first and second coils 110 are arranged at a 45 degree angle from the center of the magnetic sensor (a constant magnetic field corresponds to high uniformity of the magnetic field).

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMS, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A magnetic sensor test apparatus comprising:
   a magnetic sensor to be tested disposed on a wafer;
   a vertical coil disposed above the magnetic sensor generating a magnetic field perpendicular to the wafer; and
   at least one periphery coil adjacently disposed about the vertical coil at a nonzero inclined angle relative to a planar surface of the magnetic sensor for generating a magnetic field parallel to the planar surface of the wafer.

2. The magnetic sensor test apparatus of claim 1, further comprising:
   a probe card,
   wherein two periphery coils are symmetrically arranged around the vertical coil, and
   wherein the vertical coil and the at least one periphery coil are disposed above the magnetic sensor.

3. The magnetic sensor test apparatus of claim 1, wherein the at least one periphery coil is configured to generate a magnetic field in a horizontal direction to the wafer.

4. The magnetic sensor test apparatus of claim 1, wherein the nonzero inclined angle is an acute angle.

5. The magnetic sensor test apparatus of claim 1, wherein the at least one periphery coil comprises four coils.

6. The magnetic sensor test apparatus of claim 1, wherein the nonzero inclined angle is 45 degrees.

7. The magnetic sensor test apparatus of claim 5, wherein the four coils comprise:
   a pair of first coils being arranged in a first axis direction; and
   a pair of second coils being arranged in a second axis direction, the second axis direction being perpendicular to the first axis direction.

8. The magnetic sensor test apparatus of claim 1, further comprising:
   a plurality of probe tips configured to detect a test signal output from the magnetic sensor.

9. The magnetic sensor test apparatus of claim 1, wherein the at least one periphery coil is spaced apart from the vertical coil by a distance.

10. A magnetic sensor test method, comprising:
    generating a magnetic field in a vertical direction relative to a planar surface of a wafer on which the magnetic sensor to be tested is disposed; and
    generating a magnetic field in a horizontal direction relative to the planar surface of the wafer from pairs of first and second coils disposed at a nonzero inclined angle relative to the planar surface of the wafer.

11. The magnetic sensor test method of claim 10, wherein the first and second coils are disposed above the wafer, and
    the magnetic sensor test method is applied to the wafer comprising a plurality of magnetic sensors;
    the generating a magnetic field in a vertical direction comprises generating a magnetic field in a vertical direction of the wafer; and
    the generating a magnetic field in a horizontal direction comprises generating a magnetic field in a horizontal direction of the wafer.

12. The magnetic sensor test method of claim 10, wherein the generating a magnetic field in a vertical direction comprises applying a current to a vertical coil to test a strength of a vertical component of the magnetic field.

13. The magnetic sensor test method of claim 11, wherein current is applied to pairs of first and second coils to test a strength of a horizontal component of the magnetic field, and the nonzero inclined angle is an acute angle.

14. The magnetic sensor test method of claim 11, wherein the generating a magnetic field in a vertical direction and a horizontal direction respectively comprises testing whether the plurality of the magnetic sensors operate normally.

15. The magnetic sensor test method of claim 10, wherein the execution order of the generating a magnetic field in a vertical direction and the generating a magnetic field in a horizontal direction is irrelevant to each other.

16. A magnetic sensor test apparatus comprising:
    a probe;
    a vertical coil arranged at the center of the probe generating a magnetic field perpendicular to a wafer on which the magnetic sensor to be tested is disposed; and
    two or more periphery coils arranged symmetrically around the vertical coil at nonzero inclined angles relative to a planar surface of the wafer for generating a magnetic field parallel to the planar surface of the wafer.

17. The magnetic sensor test apparatus of claim 16, wherein the wafer comprises a magnetic sensor, and wherein the vertical coil and the two or more periphery coils are disposed above the wafer.

18. The magnetic sensor test apparatus of claim 16, wherein the nonzero inclined angles are acute angles.

19. The magnetic sensor test apparatus of claim 16, wherein the two or more periphery coils are four periphery coils which are arranged equidistantly from the vertical coil.

20. The magnetic sensor test apparatus of claim 16, wherein the nonzero inclined angles are at 45 degrees and the periphery coils generate an even magnetic field.

\* \* \* \* \*